(12) United States Patent
Kim et al.

(10) Patent No.: US 12,490,399 B2
(45) Date of Patent: Dec. 2, 2025

(54) DISPLAY DEVICE

(71) Applicant: SAMSUNG ELECTRONICS CO., LTD., Suwon-si (KR)

(72) Inventors: Taehun Kim, Suwon-si (KR); Suan Choi, Suwon-si (KR); Soonseok Seo, Suwon-si (KR); Wookjin Lee, Suwon-si (KR); Huulam Vuong Nguyen, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 182 days.

(21) Appl. No.: 18/370,620

(22) Filed: Sep. 20, 2023

(65) Prior Publication Data

US 2024/0015899 A1 Jan. 11, 2024

Related U.S. Application Data

(63) Continuation of application No. PCT/KR2022/003493, filed on Mar. 14, 2022.

(30) Foreign Application Priority Data

Mar. 22, 2021 (KR) .................. 10-2021-0036460

(51) Int. Cl.
*H05K 5/02* (2006.01)
*H05K 5/30* (2025.01)
*H01L 25/16* (2023.01)

(52) U.S. Cl.
CPC ............ *H05K 5/30* (2025.01); *H05K 5/0217* (2013.01); *H01L 25/167* (2013.01)

(58) Field of Classification Search
CPC ....... H05K 5/30; H05K 5/0217; H05K 5/0017
(Continued)

(56) References Cited

U.S. PATENT DOCUMENTS 6,803,521 B2 * 10/2004 Vrame .................. H02G 3/123
439/535
7,926,213 B1 * 4/2011 Kludt .................. H05K 5/0204
40/605
(Continued)

FOREIGN PATENT DOCUMENTS

JP 6214793 10/2017
JP 6758492 9/2020
(Continued)

OTHER PUBLICATIONS

International Search Report dated Jun. 24, 2022 in International Patent Application No. PCT/KR2022/003493.
(Continued)

*Primary Examiner* — Hung S. Bui
(74) *Attorney, Agent, or Firm* — STAAS & HALSEY LLP

(57) ABSTRACT

A display device includes: at least two mount members fixable to a wall in a row; and at least two display panels coupleable to the at least two mount members, respectively, and slidable along the at least two mount members. The at least two display panels respectively include: a base; a docking plate, coupleable to a front of the base, having a front surface to which a plurality of display modules of the at least two display panels are coupleable; and a step adjustment member, arrangeable on the base, and so that the docking plate which is coupled to the front of the base is moveable along a front direction or a rear direction of the base to change a distance between the docking plate and the base and adjust front surfaces of adjacent display panels, among the at least two display panels, relative to each other.

14 Claims, 10 Drawing Sheets

(58) Field of Classification Search
USPC .................................. 361/807, 730, 809, 810
See application file for complete search history.

(56) References Cited

U.S. PATENT DOCUMENTS

| | | | |
|---|---|---|---|
| 9,782,004 | B2 | 10/2017 | Yu et al. |
| 9,903,567 | B2 | 2/2018 | Lan et al. |
| 10,330,979 | B2 | 6/2019 | Ryu et al. |
| 11,184,986 | B2 | 11/2021 | Heo et al. |
| 11,395,548 | B2 | 7/2022 | Yoon et al. |
| 11,573,613 | B2 | 2/2023 | Mori |
| 2007/0181330 | A1* | 8/2007 | Dinh .................... H02G 3/125 |
| | | | 174/58 |
| 2016/0210886 | A1 | 7/2016 | Brashnyk et al. |

FOREIGN PATENT DOCUMENTS

| | | | |
|---|---|---|---|
| KR | 20100133778 A | * 12/2010 | ............... H04N 5/45 |
| KR | 10-2017-0018444 | 2/2017 | |
| KR | 10-1749713 | 7/2017 | |
| KR | 10-1758829 | 7/2017 | |
| KR | 10-2018-0011983 | 2/2018 | |
| KR | 10-2019-0092968 | 8/2019 | |
| KR | 10-2020-0023151 | 3/2020 | |
| KR | 10-2021-0031286 | 3/2021 | |
| WO | WO 2018/226878 A1 | 12/2018 | |
| WO | WO 2020/040616 A1 | 2/2020 | |

OTHER PUBLICATIONS

PCT/ISA/237 dated Jun. 24, 2022 in International Patent Application No. PCT/KR2022/003493.

* cited by examiner

DISPLAY DEVICE

CROSS-REFERENCE TO RELATED APPLICATION(S)

This application is a continuation application, under 35 U.S.C. § 111(a), of international application No. PCT/KR2022/003493, filed on Mar. 14, 2022, which claims priority under 35 U. S. C. § 119 to Korean Patent Application No. 10-2021-0036460, filed on Mar. 22, 2021, the disclosures of which are incorporated herein by reference in their entireties.

BACKGROUND

Field

Apparatuses and methods consistent with the disclosure relate to relate to a display device, and relates to a display device forming a large screen by connecting a plurality of display modules.

Description of the Related Art

A modular display device forms one large screen by connecting a plurality of individually modularized display panels.

When a light emitting device for displaying a subminiature image such as a micro LED is applied to the modularized display panel, a seam is visually recognized along a part where display panels come into contact due to a step generated between the display panels arranged adjacent to each other. This is a problem that occurs when a step occurs between front surfaces of the display panels. Here, the step means a height difference based on front and rear directions of the display panel.

In addition, since each display panel does not have a separate means for protecting the front surface, the step between the display panels easily occurs even when the display panel is pressed with a small force by a user. In this case, the display device should be separated from a wall and reinstalled on the wall after adjusting the step, and therefore, has a difficult problem in terms of maintenance.

SUMMARY

According to an embodiment of the disclosure, a display device may include: at least two mount members fixable to a wall in a row; and at least two display panels coupleable to the at least two mount members, respectively, and while the at least two display panels are respectively coupled to the at least two mount members, the at least two display panels are slidable along the at least two mount members. The at least two display panels respectively include: a base; a docking plate coupleable to a front of the base and having a front surface to which a plurality of display modules of the at least two display panels are coupleable; and a step adjustment member arrangeable on the base and while the step adjustment member is arranged on the base, the docking plate which is coupled to the front of the base is moveable along a front direction or a rear direction of the base to change a distance between the docking plate and the base and adjust front surfaces of adjacent display panels, among the at least two display panels, relative to each other.

The step adjustment member may include: a ball screw arrangeable along a longitudinal direction of the base; and a pushing member configured to adjust the distance between the docking plate and the base as a bending angle changes in interlocking with rotation in a first direction or in a second direction in reverse of the first direction of the ball screw.

The pushing member may include: a first link hinged to the base; and a second link having one end hinged to an end of the first link and another end hinged to a movable member movable along the ball screw.

As the ball screw of the step adjustment member rotates in the first direction, an angle between the first link and the second link may decrease so that a connection part between the first link and the second link protrudes toward the docking plate, and as the ball screw rotates in the second direction, the angle between the first link and the second link may increase so that the connection part between the first link and the second link moves toward the base.

At least one of the pushing members may be arrangeable in a left area and a right area of the base.

Two pushing members arrangeable at different heights from a lower end of the base may be arrangeable in the left area of the base, and the two pushing members arrangeable at different heights from the lower end of the base may be arrangeable in the right area of the base.

One of two pushing members arrangeable in a left area of the base may be arrangeable at a same height as one of two pushing members arrangeable in a right area of the base, and the other of the two pushing members arrangeable in the left area of the base may be arrangeable at a same height as the other of the two pushing members arrangeable in the right area of the base.

The two pushing members arrangeable in the left area of the base may be spaced apart from a left end of the base by a same distance, and the two pushing members arrangeable in the right area of the base may be spaced apart from a right end of the base by a same distance.

First, second, and third pushing members arrangeable at different heights from a lower end of the base may be arrangeable along the left area of the base, fourth, fifth, and sixth pushing members arrangeable at different heights from the lower end of the base may be arrangeable along the left area of the base, and the first and fourth pushing members may be arrangeable at positions corresponding to a half length of the base from the lower end of the base.

The second and third pushing members may be arrangeable at a same distance from the first pushing member to upper and lower sides of the first pushing member, and the fifth and sixth pushing members may be arrangeable at a same distance from the fourth pushing member to the upper and lower sides of the first pushing member.

The first pushing member may be spaced apart from a left end of the base by a first distance, the second and third pushing members may be spaced apart from the left end of the base by a second distance longer than the first distance, the fourth pushing member may be spaced apart from the right end of the base by a third distance equal to the first distance, and the fifth and sixth pushing members may be spaced apart from the right end of the base by a fourth distance longer than the third distance.

The display device may further include: a first group including a plurality of pushing members arrangeable at different heights from the lower end of the base in the left area of the base; and a second group including a plurality of pushing members arrangeable at different heights from the lower end of the base in the right area of the base, in which the plurality of pushing members of the first group and the plurality of pushing members of the second group may be symmetrically arrangeable with respect to a center of the base.

The display device may further include a first guide member configured to connect the at least two mount members in a row.

The mount member may include a pair of gap adjustment members protruding or retracting from a rear surface of the mount member on left and right sides of the rear surface.

The mount member may have a slide groove formed thereon, and a rear surface of the base may be provided with a sliding block that is separably inserted into the slide groove and move along the slide groove.

The display device may further include a second guide member configured to connect side ends of the at least two display panels.

The second guide member may include: an accommodating member located inside a side end of one of the at least two display panels; and a guide bar arrangeable to protrude from a side end of the other of the at least two display panels and separably inserted into the accommodating member.

At least two second guide members may be provided at different heights from the lower end of the display panel.

The display panel may further include at least two rolling supporters arrangeable at a lower end.

The rolling supporter may include: a housing coupled to a lower end of the base; and a ball rotatably arrangeable in the housing and partially protruding toward a lower end of the housing.

The at least two display panels may be arrangeable on adjacent walls constituting a corner, respectively, and have inclined surfaces formed at each side end thereof so that side ends facing each other come into contact with each other.

In addition, the disclosure may provide a display device including: a plurality of mount members along to a wall in a row; a plurality of display panels, coupleable to the plurality of mount members, respectively, and while the plurality of display panels are respectively coupled to the plurality of mount members, the plurality of display panels are slidable along the plurality of mount members; and a plurality of step adjustment members arrangeable inside each display panel at intervals along a longitudinal direction of the display panel and adjusting a step between front surfaces of each display panel, in which the plurality of step adjustment members are arrangeable in the left and right areas of the display panel, thereby achieving the above objects.

Each step adjustment member may include: a ball screw arrangeable inside the display panel along the longitudinal direction of the display panel; an adjustment bolt rotating the ball screw in a forward or reverse direction; and a pushing member adjusting a separation distance between a rear part of the display panel and a front part of the display panel as the pushing member is connected to the ball screw and a bending angle changes by a forward or reverse rotation of the adjustment bolt.

The pushing member may include a first link; and a second link having one end hinged to the other end of the first link and the other end hinged to a movable member movable along the ball screw, in which an angle between the first link and the second link may decrease when the adjustment bolt rotates in a forward direction, and the angle between the first link and the second link may increase when the ball screw rotates in a reverse direction.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

Figure 1:
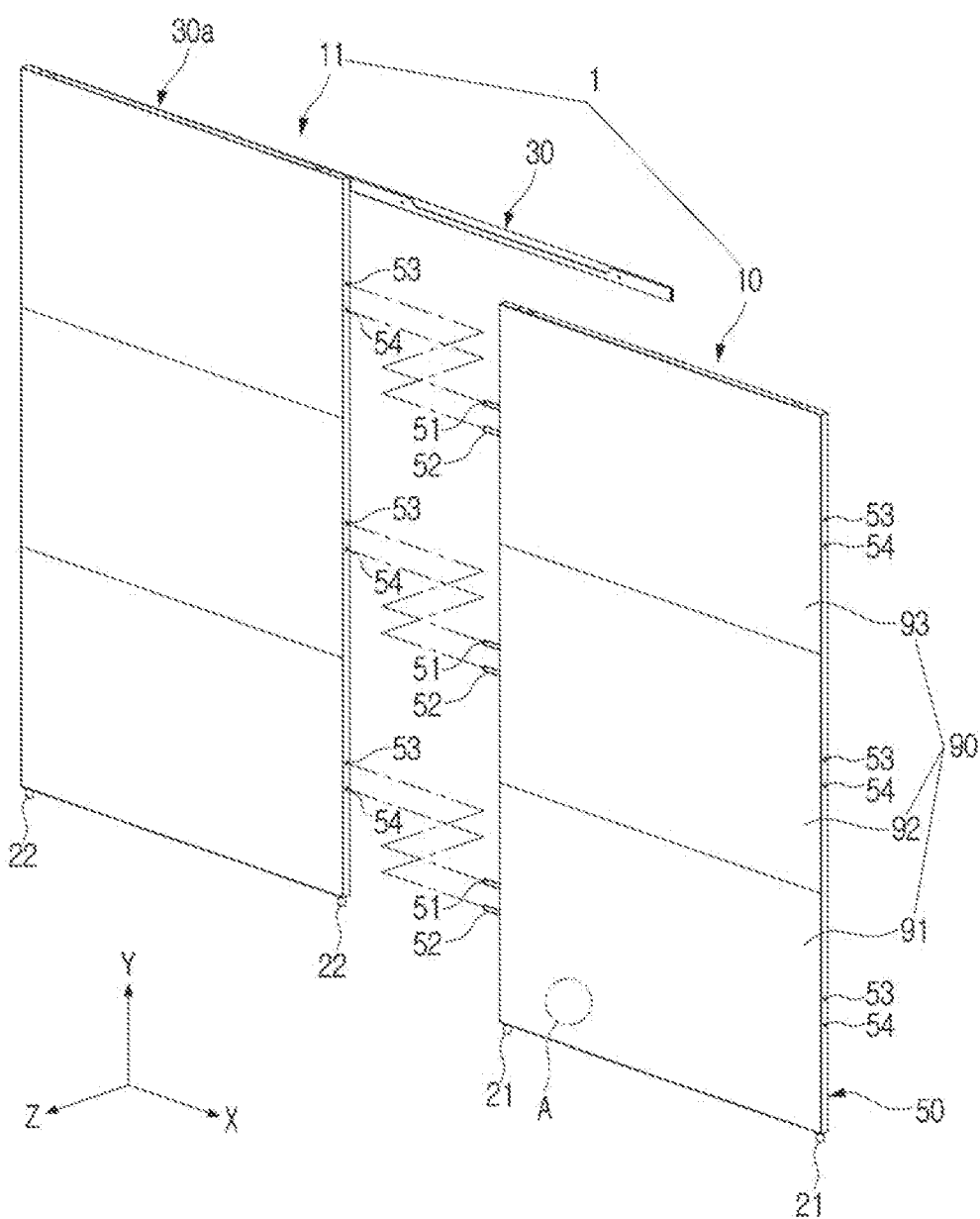
FIG. 1 is a perspective view illustrating a display device according to an embodiment of the disclosure.

Hereinafter, various embodiments will be described in more detail with reference to the accompanying drawings. Embodiments mentioned in the present specification may be variously modified. A specific embodiment may be illustrated in the drawings and be described in detail in a detailed description. However, the specific embodiment illustrated in the accompanying drawings is provided only to allow various embodiments to be easily understood. Therefore, it should be understood that the spirit of the disclosure is not limited by the specific embodiment illustrated in the accompanying drawings, but includes all the modifications, equivalents, and substitutions included in the spirit and the scope of the disclosure.

In the disclosure, terms including ordinal numbers such as "first," "second," and the like, may be used to describe various components. However, these components are not limited by these terms. The terms are used only to distinguish one component from another component.

It should be further understood that terms "include" or "have" used in the present specification specify the presence of features, numerals, steps, operations, components, parts mentioned in the present specification, or combinations thereof, but do not preclude the presence or addition of one or more other features, numerals, steps, operations, components, parts, or combinations thereof. It is to be understood that when one element is referred to as being "connected to" or "coupled to" another element, it may be connected directly to or coupled directly to another element or be connected to or coupled to another element, having the other element intervening therebetween. On the other hand, it should be understood that when one element is referred to as being "connected directly to" or "coupled directly to" another element, it may be connected to or coupled to another element without the other element interposed therebetween.

In the disclosure, the expression "same" means not only completely matching, but also including a degree of difference considering an error range.

The disclosure provides a display device capable of preventing a seam from being visually recognized at a part where adjacent display panels come into contact by easily adjusting a step between front surfaces of adjacent display panels in a state in which each display panel is installed on a wall.

In addition, in describing the disclosure, when it is decided that a detailed description for the known functions or configurations related to the disclosure may unnecessarily obscure the gist of the disclosure, the detailed description therefor will be omitted.

In the disclosure, a plurality of display modules included in a display panel may include a plurality of self-light emitting devices for displaying images. These self-emitting devices may be inorganic light emitting diodes (LEDs) and provide better contrast, response time and energy efficiency compared to liquid crystal display (LCD) panels that require a backlight.

In the disclosure, a light emitting device for displaying an image means a light emitting diode (LED) having a size of 100 μm or less, which is a subminiature inorganic light emitting device. In the disclosure, the LED may be, for example, a mini LED having a size of about 50 μm or less or a micro LED having a size of about 30 μm or less smaller than the mini LED.

The LED of the disclosure may implement high resolution, excellent color, contrast, and brightness, accurately express a wide range of colors, and implement a clear screen even outdoors in bright sunlight. In addition, the LED of the disclosure is resistant to burn-in and generates less heat, ensuring a long lifespan without deformation. The LED of the disclosure may have a flip chip structure in which an anode and cathode electrodes are formed on the same first surface and a light emitting surface is formed on a second surface opposite to a first surface on which the electrodes are formed.

In the disclosure, a TFT layer on which a thin film transistor (TFT) circuit is formed may be arranged on a front surface of a substrate provided in a display panel, and a power supply circuit for supplying power to the TFT circuit, a data driving driver, a gate driving driver, and a timing controller for controlling each driving driver may be arranged on a rear surface of the substrate. A plurality of pixels arranged in the TFT layer may be driven by a TFT circuit. The driving drivers may be directly bonded to the substrate through a chip on board (COB) bonding method. Here, the COB bonding method refers to a case in which the substrate is made of synthetic resins. In addition, the driving drivers may be directly bonded to a TFT substrate through a chip on class (COG) bonding method. In the disclosure, the synthetic resin-based substrate may be, for example, a substrate made of a material such as polyimide (PI), polyethylene terephthalate (PET), polyethersulfone (PES), polyethylene naphthalate (PEN), or polycarbonate (PC). In some cases, a glass substrate or a ceramic substrate may be used as the substrate.

In the disclosure, the TFT layer on which the TFT circuit is formed is arranged on the front surface of the substrate, and the circuit may not be arranged on the rear surface of the substrate. The TFT layer may be integrally formed on the substrate or made in the form of a separate film and attached to one surface of the glass substrate.

In the disclosure, the TFT constituting the TFT layer (or backplane) is not limited to a specific structure or type. For example, the TFT cited in the disclosure may be implemented as an oxide TFT and Si TFT (poly silicon, a-silicon), an organic TFT, a graphene TFT, etc., in addition to low-temperature polycrystalline silicon TFT (LTPS TFT), and in the Si wafer CMOS process, only a P-type (or N-type) MOSFET may be made and applied. A pixel driving method of a display module may be an active matrix (AM) driving method or a passive matrix (PM) driving method. The display module may form a wiring pattern electrically connected to each LED according to an AM driving method or a PM driving method.

In the disclosure, a plurality of pulse amplitude modulation (PAM) control circuits may be arranged in one pixel area. In this case, each sub-pixel arranged in one pixel area may be controlled by a corresponding PAM control circuit. Also, a plurality of pulse width modulation (PWM) control circuits may be arranged in one pixel area. In this case, each sub-pixel arranged in one pixel area may be controlled by a corresponding PAM control circuit. Also, a plurality of PAM control circuits and a plurality of PWM control circuits may be arranged in one pixel area together. In this case, some of the sub-pixels arranged in one pixel area may be controlled by the PAM control circuit and the rest may be controlled by the PWM control circuit. Also, each sub-pixel may be controlled by the PAM control circuit and the PWM control circuit.

Hereinafter, a display device according to an embodiment of the disclosure will be described with reference to the drawings. In the disclosure, 'horizontal direction' means an X-axis direction, 'vertical direction' means a Y-axis direction, and 'front-rear direction' means a Z-axis direction, respectively.

Figure 2:
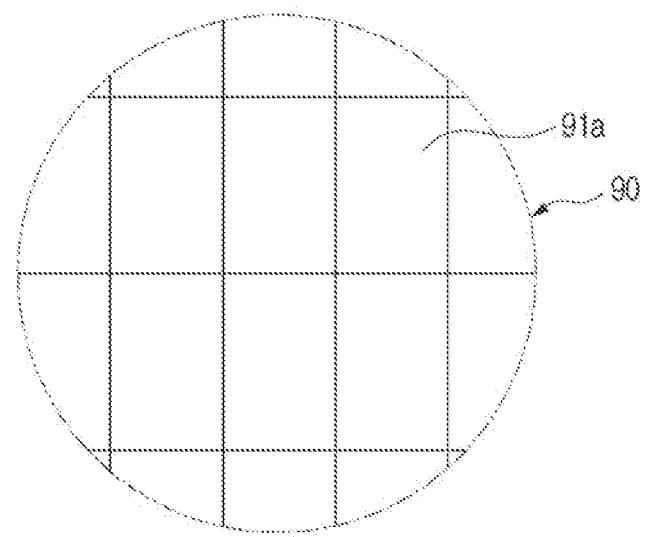
FIG. 2 is an enlarged view of part A illustrated in FIG. 1 according to an embodiment of the disclosure.

FIG. 1 is a perspective view illustrating a display device according to an embodiment of the disclosure, and FIG. 2 is an enlarged view of part A illustrated in FIG. 1.

Referring to FIG. 1, a display device 1 according to an embodiment of the disclosure may include first and second display panels 10 and 11 installed on a wall by first and second mount members 30 and 30a.

In the disclosure, the display device 1 is described as including two display panels 10 and 11, but is not limited thereto. For example, the display device 1 may have at least two or more display panels continuously arranged horizontally along a wall. In this case, the number of mount members may be the same as the number of display panels.

A height of the display device 1 according to the disclosure may vary, and for example, a maximum height of the display device 1 may be a height adjacent to a ceiling from a floor in a vertical direction. This is a height considering the fact that the first and second display panels 10 and 11 constituting the display device 1 may slide along the floor.

The first and second mount members 30 and 30a are installed on the wall and are horizontally arranged at a predetermined height from the floor. The horizontal lengths of the first and second mount members 30 and 30a may each correspond to the horizontal lengths of the first and second display panels 10 and 11, respectively.

When the display device 1 is installed on a wall, first, the second mount member 30a is fixed to the wall at a predetermined height, and the second display panel 11 is slidably coupled to the second mount member 30a.

The second display panel 11 is coupled to the second mount member 30a, and then may be slidably seated on the floor by rolling supporters 22 arranged on both sides of a lower end.

The first mount member 30 is installed on the wall at the same height as the second mount member 30a. In this case, the first mount member 30 may be accurately arranged in a row with the second mount member 30a by a first guide member.

The first guide member may include a pair of guide bars 31 and 32 protruding from the left end of the first mount member 30 and insertion grooves 33 and 34 formed at the right end of the second mount member 30a. Guide bars 31 and 32 and the insertion grooves 33 and 34 corresponding thereto may be provided with at least one and may be formed of the same number of each other.

The first display panel 10 is coupled to the first mount member 30 and slides toward the second display panel 11 along the first mount member 30 so as to come into contact with the second display panel 11. In this case, the first display panel 10 may be slidably seated on the floor by the rolling supporters 21 arranged on both sides of the lower end.

The rolling supporter 21 may include a housing 21a that protrudes from the lower end (or the lower end of the base 50) of the first display panel 10 and a ball 21b that is rotatably arranged in the housing 21a and partially protrudes to an outside of the housing 21a and comes into contact with the floor.

The pair of rolling supporters 22 arranged at the lower end of the second display panel 11 may have the same configuration as the pair of rolling supporters 21 arranged at the lower end of the first display panel 10.

In the display device 1 according to the disclosure, at least one additional display panel may be continuously installed on the right side of the first display panel 10 according to the above-described installation sequence.

Referring to FIG. 1, the display panel 10 may include a display unit 90 including a plurality of display modules 91, 92, and 93. As illustrated in FIG. 2, each display module may include a plurality of small display modules 91a arranged in a matrix.

The small display module 91a includes a plurality of pixels, and each pixel may include at least three sub-pixels. Each sub-pixel may be a red light emitting diode, a green light emitting diode, or a blue light emitting diode.

In addition, the sub-pixel may be a light emitting diode (LED) having a size of 100 μm or less, which is a subminiature inorganic light emitting device as a light emitting device for displaying an image. For example, the sub-pixel may be a mini LED having a size of about 50 μm or less, or a micro LED having a size of about 30 μm or less, which is smaller than the mini LED. In addition, the sub-pixel may have a flip chip structure in which an anode electrode and a cathode electrode are formed on the same first surface and a light emitting surface is formed on a second surface located on an opposite side of the first surface on which the electrodes are formed.

Hereinafter, the structure of the first display panel 10 will be described with reference to the drawings. Since the second display panel 11 has the same structure as the first display panel 10, a description of the structure of the second display panel 11 will be omitted.

Figure 3:
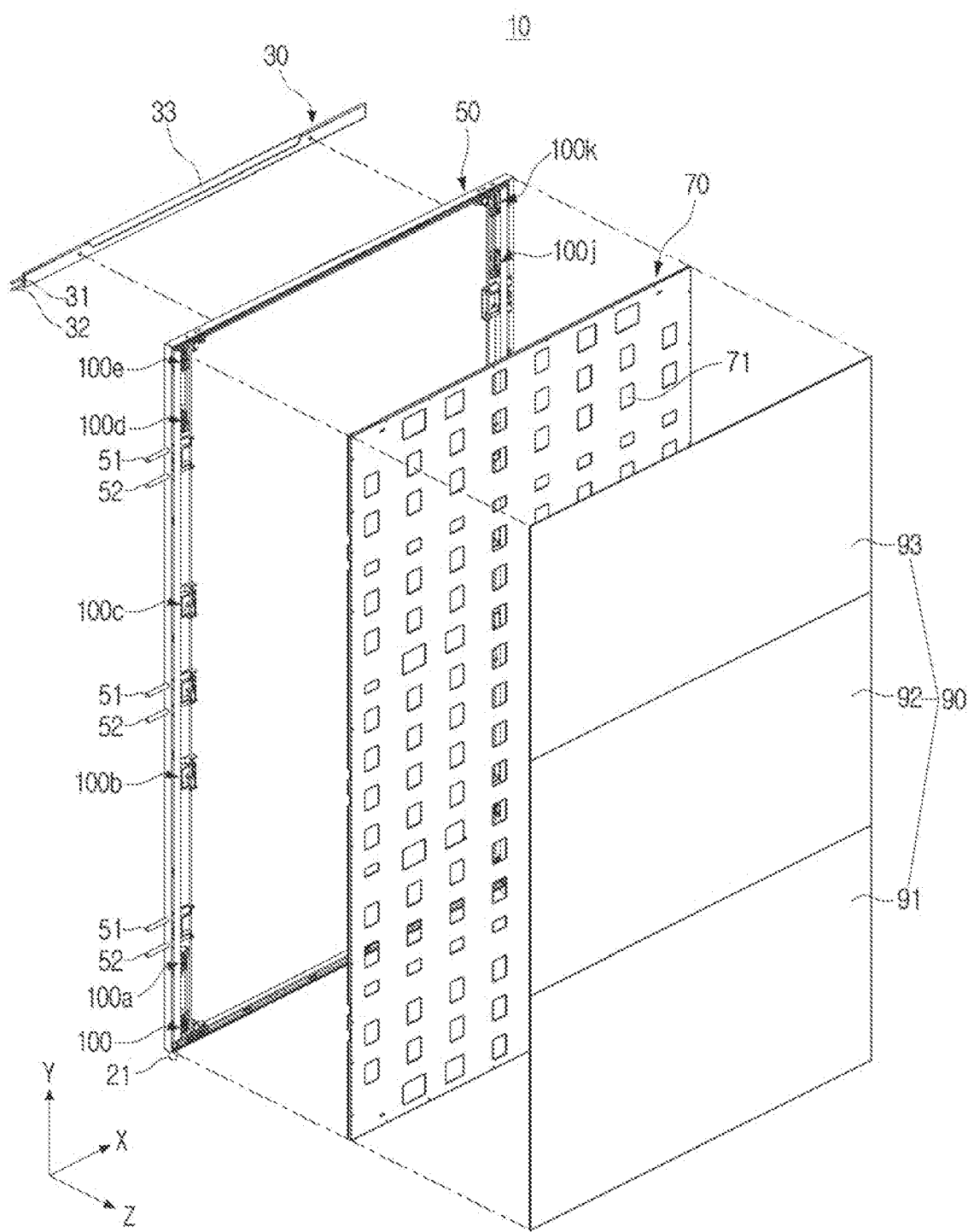
FIG. 3 is an exploded perspective view of a display panel viewed from the front according to an embodiment of the disclosure.
Figure 4:
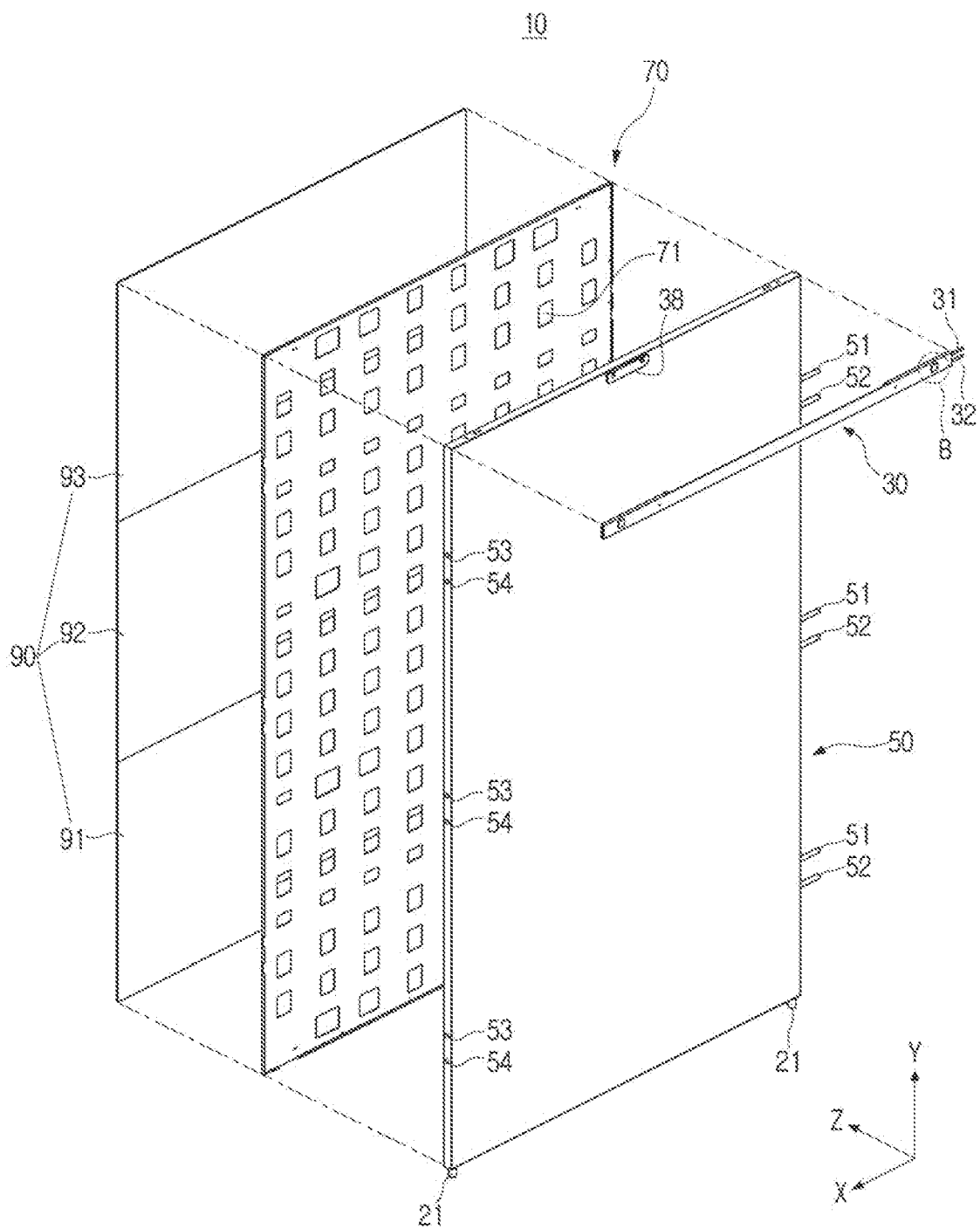
FIG. 4 is an exploded perspective view of the display panel viewed from the rear according to an embodiment of the disclosure.
Figure 5:
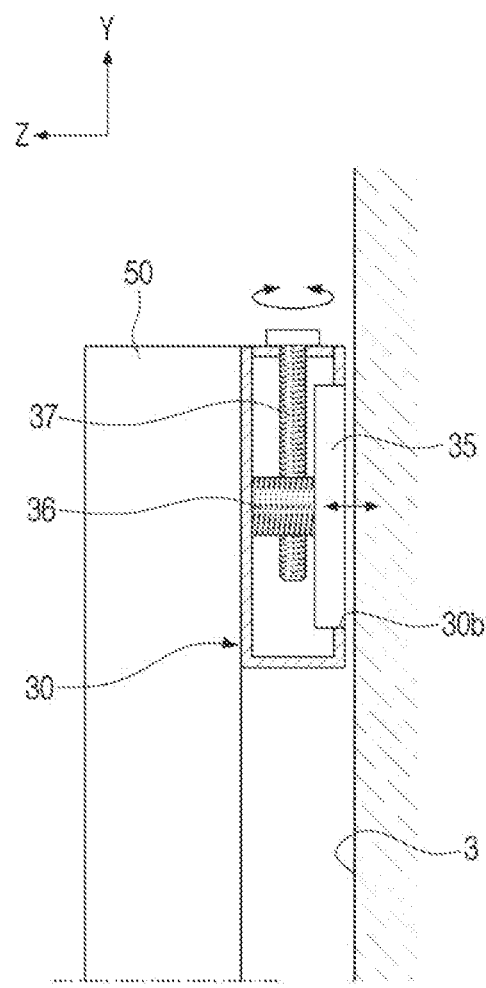
FIG. 5 is an enlarged cross-sectional view illustrating part B illustrated in FIG. 4 according to an embodiment of the disclosure.

FIG. 3 is an exploded perspective view of the display panel viewed from the front, FIG. 4 is an exploded perspective view of the display panel viewed from the rear, and FIG. 5 is an enlarged cross-sectional view of part B illustrated in FIG. 4.

Referring to FIGS. 3 and 4, the first display panel 10 may include a base 50 arranged on a wall by a first mount member 30, a docking plate 70 arranged in front of the base, and a plurality of display units 90 arranged on a front surface of the docking plate 70.

A sliding groove 33 is formed along an upper part of the first mount member 30. A sliding block 38 is coupled to an upper end of a rear surface of the base 50.

The sliding block 38 can slide left and right along a longitudinal direction of the first mount member 30 in a state where a lower end of the sliding block 38 is inserted into a sliding groove 33. In this case, although not illustrated in the drawings, at least two rollers may be rotatably arranged along the lower end of the sliding block 38. When the sliding block 38 is inserted into the sliding groove 33, the roller is seated on a bottom surface of the sliding groove 33, so the left and right movement of the first display panel 10 may be smoothly performed.

A plurality of step adjustment members may be arranged on the front surface of the base 50. The plurality of step adjustment members may move the docking plate 70 arranged in front of the base 50 in a direction (−Z axis direction) approaching the base 50 or in a direction (+Z axis direction) away from the base 50. The structure of the step adjustment member will be described later.

The base 50 may be connected to a base of an adjacent display panel in an accurate position by a second guide member.

The second guide member may include a pair of protruding guide bars 51 and 52 at intervals along the left end of the base 50 and accommodating members 53 and 54 arranged in pairs at intervals in a non-protruding state along the right end of the base of the adjacent second display panel 11. The guide bars 51 and 52 may be separably inserted into corresponding accommodating members 53 and 54, respectively.

The guide bars 51 and 52 and the accommodating members 53 and 54 need not be limited to the numbers or arrangement positions illustrated in the disclosure, and may be appropriately provided according to a vertical length of the base 50.

Meanwhile, the guide bars 51 and 52 may have terminals (not illustrated) at their ends, and the accommodating members 53 and 54 may have sockets to which the terminals are connected. By inserting the guide bars 51 and 52 into the accommodating members 53 and 54, the guide bars 51 and 52 and the accommodating members 53 and 54 may be electrically connected. In this case, the second guide member may be used as a passage for supplying power between the first and second display panels 10 and 11.

A display unit 90 including a plurality of display modules 91, 92, and 93 may be coupled to the front surface of the docking plate 70. In addition, a control module (not illustrated) for controlling the plurality of display modules 91, 92, and 93 may be arranged on the rear surface of the docking plate 70. The docking plate 70 may be formed with a plurality of holes 71 through which wires electrically connecting the control module and the plurality of display modules 91, 92, and 93 pass.

The docking plate 70 may be movably coupled to the front of the base 50 without being completely fixed. For example, the docking plate 70 may be movably coupled to the base 50 through a plurality of elastic members, and may also be movably coupled to the base 50 by various coupling methods.

Accordingly, when operating the plurality of step adjustment members, the distance of the docking plate 70 from the base 50 may be adjusted in the Z-axis direction while the docking plate 70 is not separated from the base 50.

Referring to FIG. 5, gap adjustment members may be arranged on both sides of the rear surface of the first mount member 30, respectively. The gap adjustment member protrudes or is drawn in based on the rear surface of the first mount member 30.

The gap adjustment member may include a contact piece 35 slidably coupled to a through hole 30b formed on the rear surface of the first mount member 30, a worm gear 36 connected to the contact piece 35, and a worm 37 that is gear-connected to the worm gear 36.

The worm 37 is arranged above the first mount member 30 to be rotatable in a forward or reverse direction. An upper end of the worm 37 may be exposed to the outside of the first mount member 30 and the remaining part thereof may be located inside the first mount member 30.

The worm gear 26 arranged inside the first mount member 30 rotates in a forward or reverse direction in interlocking with the forward or reverse rotation of the worm 37. One side of the worm gear 26 is rotatably connected to the inside of the front surface of the first mount member 30 and the other side thereof is screwed to the contact piece 35 while penetrating the contact piece 35.

The contact piece 35 may advance or retreat along the first screw 36 in the direction toward the wall 3 and in the opposite direction in interlocking with the rotation of the first mount member 30. For example, when the second screw 37 rotates in a forward direction, the contact piece 35 may rotate in a forward direction and advance toward the wall 3 side (−Z axis direction) to adhere to the wall surface. On the other hand, when the second screw 37 rotates in a reverse direction, the contact piece 35 may rotate in a reverse direction and retreat toward the inside (+Z axis direction) of the first mount member 30 to be spaced apart from the wall surface.

A worm gear method was adopted as a power transmission structure for advance or retreat the contact piece 35, but it is not necessary to be limited thereto, and it is also possible to apply a power transmission structure that transmits power in an orthogonal direction, such as a rack and pinion method or a bevel gear method.

The gap adjustment member may eliminate or minimize a predetermined gap between the rear surface of the first mount member 30 and the wall surface when the wall surface on which the first mount member 30 is installed is not flat. Accordingly, when the first mount member 30 is installed on the wall, the first mount member 30 may be stably installed while the first mount member 30 adheres to the wall surface by using the gap adjustment member. The first display panel 10 coupled to the first mount member 30 through the sliding block 38 may be stably installed so as not to flow.

Similar to the first mount member 30, the gap adjustment members may be arranged on both sides of the rear surface of the second mount member 30a.

Figure 6:
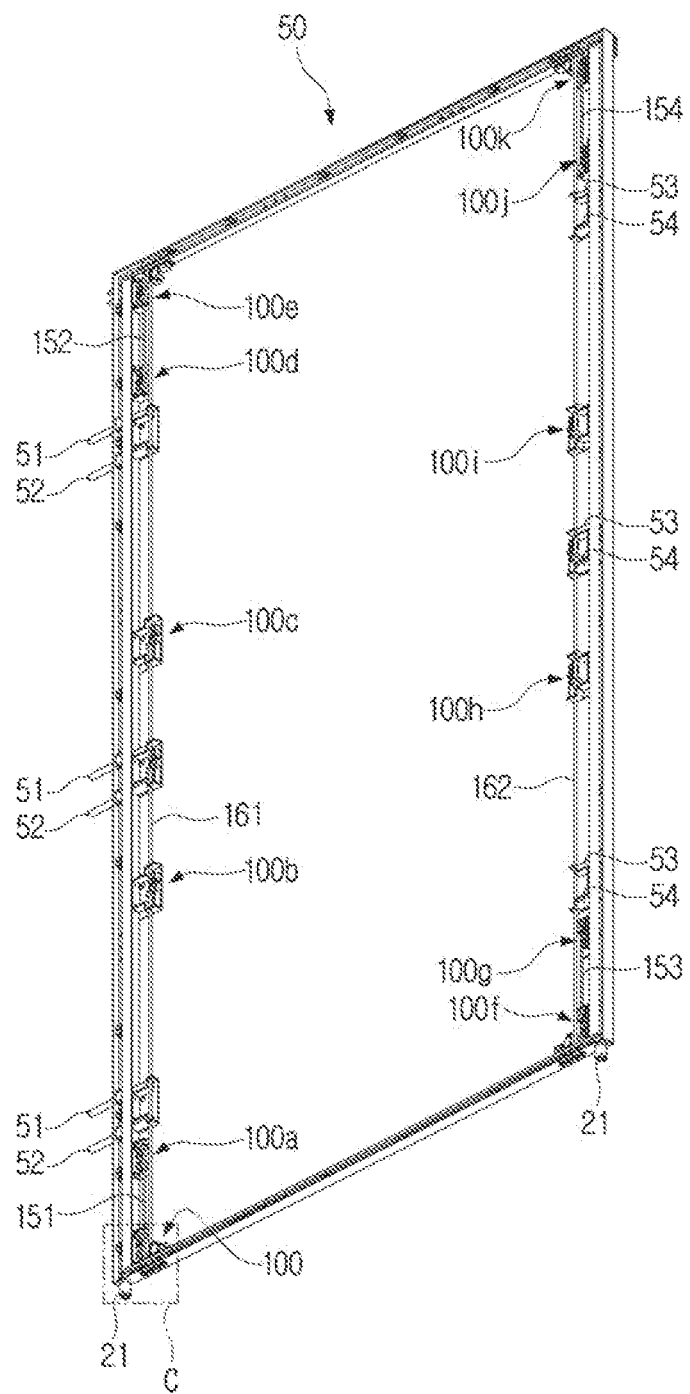
FIG. 6 is a perspective view illustrating an example in which a plurality of adjustment members are symmetrically arranged in left and right areas of a base, respectively, according to an embodiment of the disclosure.
Figure 7:
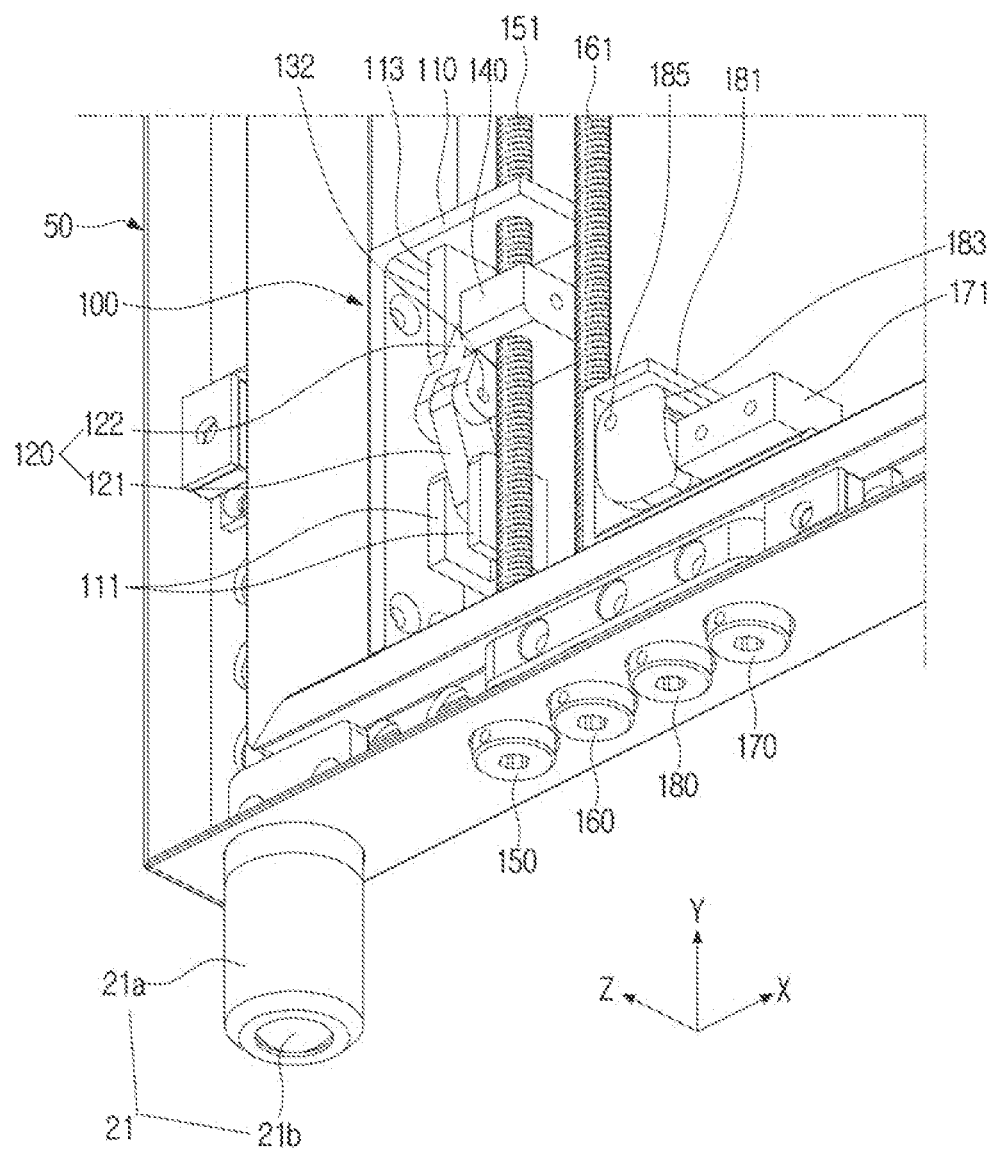
FIG. 7 is an enlarged view of part C of FIG. 6 according to an embodiment of the disclosure.
Figure 8:
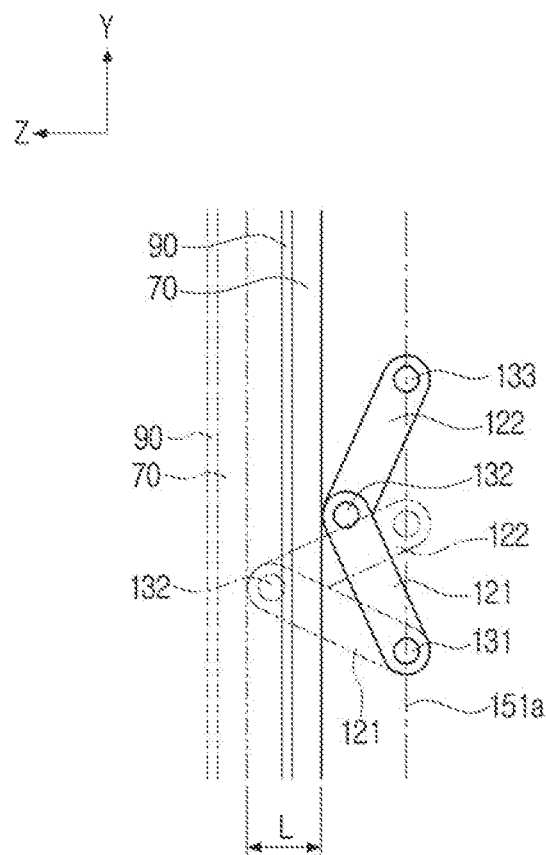
FIG. 8 is a diagram illustrating an example in which a distance between a docking plate and a base is adjusted by an adjustment member according to an embodiment of the disclosure.

FIG. 6 is a perspective view illustrating an example in which the plurality of step adjustment members are symmetrically arranged in the left and right areas of the base, respectively, FIG. 7 is an enlarged view of part C of FIG. 6, and FIG. 8 is a view illustrating an example in which the distance between the docking plate and the base is adjusted by the step adjustment member.

Referring to FIG. 6, the plurality of step adjustment members may be arranged along the longitudinal direction of the base 50 at intervals on the left and right areas of the front surface of the base 50, respectively.

For example, four step adjustment members 100, 100a, 100d, and 100e may be arranged in the left area of the front surface of the base 50 along the same axis so as to be adjacent to the left end of the base 50, and two step adjustment members 100b and 100c may be arranged along the same axis at positions slightly further away than the four step adjustment members 100, 100a, 100d, and 100e from the left end of the base 50.

Six step adjustment members 100, 100a, 100b, 100c, 100d, and 100e arranged on the left area of the front surface of the base 50 may be adjacently arranged by two on each of the upper, central, and lower parts of the left area. Four step adjustment members 100, 100a, 100d, and 100e are connected to two ball screws 151 and 152 by two, and two step adjustment members 100b and 100c may be connected to one ball screw 161.

The two ball screws 151 and 152 may be arranged along the same axis and may have a shorter vertical length than other ball screws 161. Each of the ball screws 151, 152, and 161 may be arranged along the longitudinal direction of the base 50 and may be connected to the base 50 to be rotatable in a forward or reverse direction.

In addition, a plurality of step adjustment members 100f, 100g, 100h, 100i, 100j, and 100k arranged on the right side of the front surface of the base 50 may be symmetrically arranged with the plurality of step adjustment members 100, 100a, 100b, 100c, 100d, and 100e arranged in the left area of the front surface based on a center line along the longitudinal direction of the base 50.

For example, four step adjustment members 100f, 100g, 100j, and 100k may be arranged in the right area of the front surface of the base 50 along the same axis so as to be adjacent to the right end of the base 50, and two step adjustment members 100h and 100i may be arranged along the same axis at positions slightly further away than the four step adjustment members 100f, 100g, 100j, and 100k from the right end of the base 50.

Six step adjustment members 100f, 100g, 100h, 100i, 100j, and 100k arranged on the right area of the front surface of the base 50 may be adjacently arranged by two on each of the upper, central, and lower parts of the right area. Four step adjustment members 100f, 100g, 100j, and 100k may be connected to two ball screws 153 and 154 by two, and two step adjustment members 100h and 100i may be connected to one ball screw 162.

The two ball screws 153 and 154 may be arranged along the same axis and may have a shorter vertical length than other ball screws 162. Each of the ball screws 153, 154, and 162 may be arranged along the longitudinal direction of the base 50 and may be connected to the base 50 to be rotatable in a forward or reverse direction.

In the disclosure, six step adjustment members may be arranged in the left area of the front surface of the base 50 and arranged in the right area of the front surface of the base 50, but the number or arrangement of the step adjustment members needs not to be limited thereto, and the appropriate number of step adjustment members may be arranged in the left area and right area of the base 50, respectively, in consideration of the vertical length of the base 50.

As illustrated in FIG. 1, when the second display panel 11 is first installed on the wall and then the first display panel 10 is arranged to come into contact with the right side of the second display panel 11, the step adjustment member adjusts the heights (height protruding or drawn in along the Z-axis direction) of the front surfaces of the first and second display panels 10 and 11 to eliminate or minimize the step between the front surfaces of the first and second display panels 10 and 11, thereby preventing a seam from appearing at a part where the first and second display panels 10 and 11 come into contact.

In this case, by adjusting the plurality of step adjustment members located in the right area of the second display panel 11 or by adjusting the plurality of step adjustment members located in the left area of the first display panel 10, it is possible to eliminate or minimize the step between the first and second display panels 10 and 11.

The plurality of step adjustment members disposed in the left and right areas of the front surfaces of the base 50 have the same structure, and the structure of one step adjustment member 100 illustrated in FIG. 7 will be mainly described.

Referring to FIG. 7, the step adjustment member 100 may include a ball screw 151 disposed along the longitudinal direction of the base 50, an adjustment bolt 150 rotating the ball screw 151 in a forward or reverse direction, and a pushing member 120 adjusting the front step of the first and second display panels 10 and 11 by adjusting the distance between the base 50 and the docking plate 70 as the bending angle changes in interlocking with the forward or reverse rotation of the ball screw 151.

The adjustment bolt 150 may be rotatably disposed at the lower end of the base 50. In this case, ahead part of the adjustment bolt 150 may be exposed to the outside of the lower end of the base 50 so that a worker may easily access the adjustment bolt 150. A worker may rotate the adjustment bolt 150 in a forward or reverse direction using a tool such as a hexagonal wrench.

The ball screw 151 has one end connected to the adjustment bolt 150, and may rotate in a forward or reverse direction according to the rotation of the adjustment bolt 150.

The ball screw 151 penetrates through a portion of the bracket 110 surrounding a portion of the pushing member 120 and is rotatably supported. The ball screw 151 may be screwed with the movable member 140.

Since one surface of the movable member 140 is in surface contact with the inner surface of the base 50, when the ball screw 151 rotates in a forward or reverse direction, the movable member 140 moves along the ball screw 151 in one direction or in the reverse direction without rotating along with the ball screw 151. The moving distance of the movable member 140 corresponds to a rotational angle of the ball screw 151.

The movable member 140 may be connected to a portion (a second link 122 to be described later) of the pushing member 120 and may adjust the bending angle of the pushing member 120.

The pushing member 120 may include a first link 121 and a second link 122 hinged to each other.

One end of the first link 121 is hinged to the base 50 by a first hinge shaft 131 (see FIG. 8), and the other end thereof is hinged to one end of the second link 122 by a second hinge shaft 132.

The second link 122 is bendably connected to the first link 121 through the second hinge shaft 132. The other end of the second link 122 is hinged to the movable member 140 by a third hinge shaft 133.

In the pushing member 120, the connection part of the first and second links 121 and 122 connected by the second hinge shaft 132 may interlock with the forward or reverse rotation of the ball screw 151 to protrude the docking plate 70 in the pushing direction or the opposite direction. The operation of the pushing member 120 will be described with reference to the drawings.

Referring to FIG. 8, when the adjustment bolt 150 rotates in the forward direction, the ball screw 151 rotates in the forward direction along with the adjustment bolt 150.

Accordingly, the movable member 140 moves along the ball screw 151 in a −Y axis direction. When the other end of the second link 122 moves in the −Y axis direction along with the movable member 140, the first link 121 rotates counterclockwise around the first hinge axis 131 in interlocking therewith.

The angle between the first and second links 121 and 122 decreases, and the connection part of the first and second links 121 and 122 hinged by the second hinge shaft 132 moves toward the docking plate 70.

The docking plate 70 is pushed in the +Z-axis direction by the connection part of the first and second links 121 and 122 to increase the gap from the base 50.

Conversely, when the adjustment bolt 150 rotates in the reverse direction, the ball screw 151 rotates in the reverse direction along with the adjustment bolt 150.

Accordingly, the movable member 140 moves along the ball screw 151 in the +Y axis direction. When the other end of the second link 122 moves in the +Y axis direction along with the movable member 140, the first link 121 rotates clockwise around the first hinge axis 131 in interlocking therewith.

The angle between the first and second links 121 and 122 increases, and the connection part of the first and second links 121 and 122 moves toward the base 50.

The distance of the docking plate 70 from the base 50 decreases as the connection part of the first and second links 121 and 122 moves in the −Z axis direction.

According to the manipulation of the step adjustment member 100, the step between the front surface of the display unit 90 moving along with the docking plate 70 and the front surface (i.e., the front surface of the display unit) of the adjacent display panel may be adjusted. "L" indicated in FIG. 8 represents the distance at which the step may be adjusted.

The display device 1 of the disclosure appropriately adjusts a plurality of step adjustment members disposed on the left and right areas of the first and second display panels 10 and 11 to eliminate or minimize the step of the front surfaces of the adjacent display panels 10 and 11, thereby easily preventing the seam from appearing at a part where the display panels 10 and 11 come into contact with each other.

In FIG. 7, non-explained reference numeral 161 denotes a ball screw for simultaneously operating the other pushing members 100b and 100c, and reference numeral 160 denotes the adjustment bolt for rotating the ball screw 161 in the forward or reverse direction.

Meanwhile, in the disclosure, an X-axis direction adjustment member for adjusting the position of the display unit 120 in the Z-axis direction and a Y-axis direction adjustment member for adjusting the position of the display unit 120 in the Y-axis direction may be included. Since the docking plate 70 may be movably connected to the base 50 by, for example, a plurality of elastic members, the docking plate 70 can move in the Z-axis direction as well as the X-axis direction and the Y-axis direction. Accordingly, the position of the display unit 120 disposed on the front surface of the docking plate 70 may be adjusted by a predetermined distance in the X-axis direction and the Y-axis direction.

Referring to FIG. 7, the X-axis adjustment member includes an adjustment bolt 180 rotatably installed at the lower end of the base 50, a cam 183 that rotates around the hinge shaft 185 by interlocking with the rotation of the adjustment bolt 180, and a rib 181 limiting rotation of the cam 183.

When the adjustment bolt 180 rotates in the forward or reverse direction, the cam 183 presses a fixed block 171 of the Y-axis direction adjustment member disposed on one side in the +X-axis direction or releases the pressure in the −X-axis direction. Accordingly, the position of the display unit 120 may be adjusted in the X-axis direction.

The Y-axis direction adjustment member may include an adjustment bolt 190 rotatably installed at the lower end of the base 50 and a fixing block 171 screwed to the adjustment bolt 180 and connected to the docking plate 70.

When the adjustment bolt 180 rotates in the forward or reverse direction, the fixing block 171 may move in the +Y axis direction or the −Y axis direction along with the docking plate 70. Accordingly, the position of the display unit 120 may be adjusted in the Y-axis direction.

Figure 9:
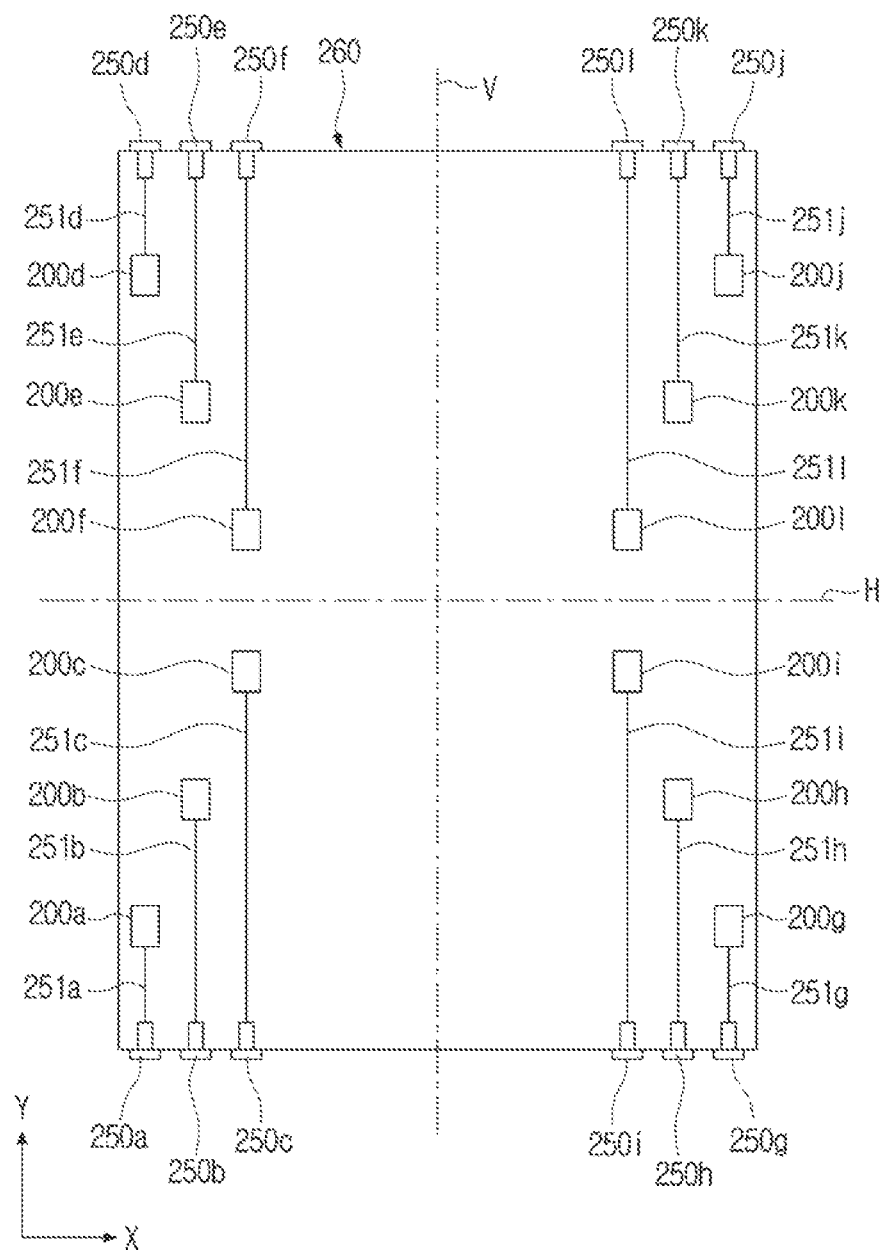
FIG. 9 is a diagram illustrating another arrangement of a plurality of adjustment members on the base according to an embodiment of the disclosure.

FIG. 9 is a diagram illustrating another arrangement of the plurality of step adjustment members on the base; and the step adjustment member illustrated in FIG. 9 is schematically expressed in the form of a square block.

Referring to FIG. 9, the plurality of step adjustment members may be arranged in various patterns on a base 260.

For example, in the left area of the front surface of the base 260, a first pushing member 200a may be arranged adjacent to the lower left corner of the base 260, and second and third pushing members 200b and 200c may be sequentially spaced apart in a diagonal direction from the lower left corner of the base 260 to the upper right corner of the base 260.

First to third ball screws 251a, 251b, and 251c may be formed to have different lengths according to positions of corresponding first to third pushing members 200a, 200b, and 200c. First to third adjustment bolts 250a, 250b, and 250c coupled to one end of the first to third ball screws 251a, 251b, and 251c, respectively, are arranged on the lower left side of the base 260 at intervals.

In the left area of the front surface of the base 260, a fourth pushing member 200d may be arranged adjacent to the upper left corner of the base 260, and fifth and sixth pushing members 200e and 200f may be sequentially spaced apart in a diagonal direction from the upper left corner of the base 260 to the lower right corner of the base 260.

Fourth to sixth ball screws 251d, 251e, and 251f may be formed to have different lengths according to positions of corresponding fourth to sixth pushing members 200d, 200e, and 200f. Fourth to sixth adjustment bolts 250d, 250e, and 250f coupled to one end of the fourth to sixth ball screws 251d, 251e, and 251f, respectively, are arranged on the upper left side of the base 260 at intervals.

As such, the plurality of step adjustment members formed on the upper left area of the front surface of the base 260 are symmetrically disposed with the plurality of step adjustment members formed on the lower part of the left area of the front surface of the base 260 based on a horizontal center line H.

In addition, the plurality of step adjustment members arranged on the right area of the front surface of the base 260 may be symmetrically arranged with the plurality of step adjustment members formed on the left area of the front surface of the base 260 based on a vertical center line V.

In FIG. 9, non-explained reference numerals 200g, 200h, 200i, 200j, 200k, and 200l represent the pushing member, non-explained reference numerals 250g, 250h, 250i, 250j, 250k, and 250l represent the adjustment bolt, and non-explained reference numerals 251g, 251h, 251i, 251j, 251k, and 251l represent the ball screw.

Figure 10:
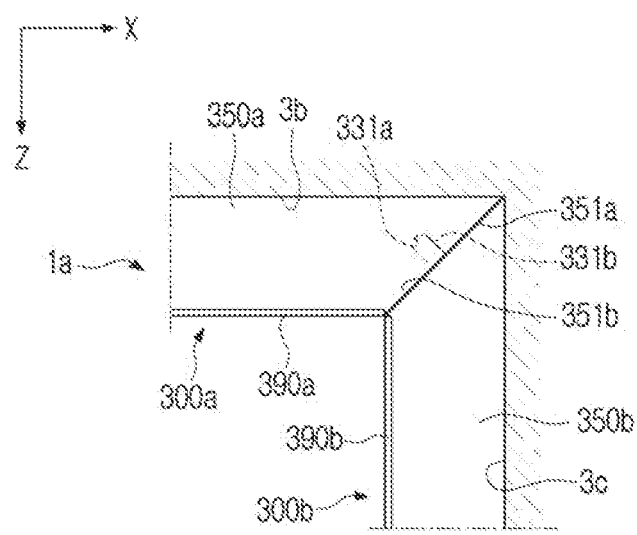
FIG. 10 is a diagram illustrating an example in which a display panel adjacent to a corner wall is arranged according to an embodiment of the disclosure.

FIG. 10 is a diagram illustrating an example in which a display panel adjacent to a corner wall is arranged.

Referring to FIG. 10, a display device 1a according to the disclosure may be installed on walls 3b and 3c constituting corners.

In this case, a first display panel 300a may be installed on a first wall 3b through a first mount member (not illustrated), and a second display panel 300b may be installed on the second wall 3c formed at a predetermined angle (for example, 90°) to the first wall 3b through the first mount member (not illustrated).

First and second inclined surfaces 351a and 351b are formed at side ends of the base 350a of the first display panel 300a and the base 350b of the second display panel 300b facing each other. Side ends of the first and second display panels 300a and 300b contacting each other by the first and second inclined surfaces 351a and 351b may be in close contact with each other without leaving a gap therebetween.

At least one groove 331a may be formed on the first inclined surface 351a and a protrusion 331b separably inserted into the groove 331a may be formed on the second inclined surface 351b. These grooves 331a and protrusions 331b may correspond to the above-described second guide member.

In addition, although not illustrated in the drawings, the first and second mount members for fixing the first and second display panels 300a and 300b to the wall may also have a configuration corresponding to the first guide member described above.

In the display device 1a illustrated in FIG. 10, the above-described plurality of step adjustment members are included in the first and second display panels 300a and 300b, respectively. The display device 1a may be adjusted to match a front surfaces 390a of the first display panel 300a and a front surfaces 390a of the second display panel 300b through plurality of step adjustment members.

The disclosure relates to a display device forming a large screen by connecting a plurality of display panels.

Although the embodiments of the disclosure have been illustrated and described hereinabove, the disclosure is not limited to the specific embodiments described above, and may be variously modified by those skilled in the art to which the disclosure pertains without departing from the scope and spirit of the disclosure as claimed in the claims. These modifications should also be understood to fall within the technical spirit and scope of the disclosure.

What is claimed is:

1. A display device, comprising:
   at least two mount members fixable to a wall in a row; and
   at least two display panels, coupleable to the at least two mount members, respectively, and while the at least two display panels are respectively coupled to the at least two mount members, the at least two display panels are slidable along the at least two mount members,
   wherein the at least two display panels respectively include:
   a base;
   a docking plate, coupleable to a front of the base, having a front surface to which a plurality of display modules of the at least two display panels are coupleable; and
   a step adjustment member, arrangeable on the base, and while the step adjustment member is arranged on the base, the docking plate which is coupled to the front of the base is moveable along a front direction or a rear direction of the base to change a distance between the docking plate and the base and adjust front surfaces of adjacent display panels, among the at least two display panels, relative to each other, wherein the step adjustment member comprises a pushing member, the pushing member being among at least one of pushing members arrangeable in a left area and a right area of the base.

2. The display device as claimed in claim 1, wherein the step adjustment member further comprises:
a ball screw arrangeable along a longitudinal direction of the base, and
wherein the pushing member is configured to adjust the distance between the docking plate and the base as a bending angle changes in interlocking with rotation of the ball screw along a first direction or in a second direction in reverse of the first direction.

3. The display device as claimed in claim 2, wherein the pushing member includes:
a first link hinged to the base; and
a second link having one end hinged to an end of the first link and another end hinged to a movable member movable along the ball screw.

4. The display device as claimed in claim 3, wherein as the ball screw of the step adjustment member rotates in the first direction, an angle between the first link and the second link decreases so that a connection part between the first link and the second link protrudes toward the docking plate, and
as the ball screw rotates in the second direction, the angle between the first link and the second link increases so that the connection part between the first link and the second link moves toward the base.

5. The display device as claimed in claim 1, wherein the pushing member and the at least one pushing members are among two pushing members arrangeable at different heights from a lower end of the base along a left area of the base, and
the step adjustment member includes two pushing members arrangeable at different heights from the lower end of the base along a right area of the base.

6. The display device as claimed in claim 5, wherein one pushing member of two pushing members is arrangeable along the left area of the base at a same height as one pushing member of two pushing members arrangeable along the right area of the base, and
another pushing member of the two pushing members is arrangeable along the left area of the base at a same height as another pushing member of the two pushing members arrangeable along the right area of the base.

7. The display device as claimed in claim 6, wherein the two pushing members arrangeable along the left area of the base are spaced apart from a left end of the base by a same distance, and
the two pushing members arrangeable along the right area of the base are spaced apart from a right end of the base by a same distance.

8. The display device as claimed in claim 1, wherein the pushing member and the at least one pushing members are among:
first, second, and third pushing members arrangeable at different heights from a lower end of the base along the left area of the base,
fourth, fifth, and sixth pushing members arrangeable at different heights from the lower end of the base along the left area of the base, and
the first and fourth pushing members arrangeable at positions corresponding to a half length of the base from the lower end of the base.

9. The display device as claimed in claim 8, wherein the second and third pushing members are arrangeable at a same distance from the first pushing member to upper and lower sides of the first pushing member, and
the fifth and sixth pushing members are arrangeable at a same distance from the fourth pushing member to the upper and lower sides of the first pushing member.

10. The display device as claimed in claim 9, wherein the first pushing member is spaced apart from a left end of the base by a first distance,
the second and third pushing members are spaced apart from the left end of the base by a second distance longer than the first distance,
the fourth pushing member is spaced apart from a right end of the base by a third distance equal to the first distance, and
the fifth and sixth pushing members are spaced apart from the right end of the base by a fourth distance longer than the third distance.

11. The display device as claimed in claim 1, the pushing member and the at least one pushing members are among:
a first group including a plurality of pushing members arrangeable at different heights from a lower end of the base along the left area of the base; and
a second group including a plurality of pushing members arrangeable at different heights from the lower end of the base in the right area of the base,
wherein the plurality of pushing members of the first group and the plurality of pushing members of the second group are symmetrically arrangeable with respect to a center of the base.

12. The display device as claimed in claim 1, further comprising:
a guide member configured to connect the at least two mount members in a row.

13. The display device as claimed in claim 1, wherein at least one mount member among the at least two mount members includes a pair of gap adjustment members protruding or retracting from a rear surface of the at least one mount member on left and right sides of the rear surface.

14. The display device as claimed in claim 1, further comprising:
a guide member configured to connect side ends of the at least two display panels,
wherein the guide member includes:
an accommodating member arrangeable inside a side end of one display panel of the at least two display panels; and
a guide bar arrangeable to protrude from a side end of another display panel of the at least two display panels and be separably insertable into the accommodating member.

* * * * *